(12) United States Patent
DelaRosa et al.

(10) Patent No.: US 6,818,990 B2
(45) Date of Patent: Nov. 16, 2004

(54) FLUORINE DIFFUSION BARRIERS FOR FLUORINATED DIELECTRICS IN INTEGRATED CIRCUITS

(75) Inventors: Mark J. DelaRosa, Latham, NY (US); Toh-Ming Lu, Loudonville, NY (US); Atul Kumar, Watervliet, NY (US)

(73) Assignee: Rensselaer Polytechnic Institute, Troy, NY (US)

( * ) Notice: Subject to any disclaimer, the term of this patent is extended or adjusted under 35 U.S.C. 154(b) by 0 days.

(21) Appl. No.: 09/542,095

(22) Filed: Apr. 3, 2000

(65) Prior Publication Data

US 2003/0057553 A1 Mar. 27, 2003

(51) Int. Cl.$^7$ ............................................. H01L 23/485
(52) U.S. Cl. ...................... 257/751; 257/752; 257/759
(58) Field of Search ...................... 257/486, 642–643, 257/645, 651, 751–755, 757–761, 765–768, 770

(56) References Cited

U.S. PATENT DOCUMENTS

| | | | |
|---|---|---|---|
| 4,680,612 A * | 7/1987 | Hieber et al. ................ | 357/71 |
| 5,880,018 A * | 3/1999 | Boeck et al. ................ | 438/619 |
| 6,017,818 A * | 1/2000 | Lu ............................. | 438/653 |
| 6,184,550 B1 * | 2/2001 | Van Buskirk et al. ...... | 257/306 |
| 6,232,662 B1 * | 5/2001 | Saran ......................... | 257/750 |
| 6,252,303 B1 * | 6/2001 | Huang ........................ | 257/758 |
| 6,258,732 B1 * | 7/2001 | Lin et al. ................... | 438/780 |
| 6,265,779 B1 * | 7/2001 | Grill et al. ................. | 257/759 |
| 6,277,730 B1 * | 8/2001 | Yuasa et al. ............... | 438/627 |
| 6,281,584 B1 * | 8/2001 | Ngo et al. .................. | 257/758 |
| 6,284,657 B1 * | 9/2001 | Chooi et al. ............... | 438/687 |
| 6,294,396 B1 * | 9/2001 | Nogami et al. ............ | 438/16 |
| 6,323,555 B1 * | 11/2001 | Maex et al. ................ | 257/758 |

FOREIGN PATENT DOCUMENTS

JP          411354464 A * 12/1999  ........... H01L/21/28

OTHER PUBLICATIONS

S. Wolf and R.N. Tauber, "Silicon Processing for the VLSI Era", vol. 1—Process Technology, Second Edition, Lattice Press, Sunset Beach, CA (USA), 2000. In particular, pp. 792–794, ISBN: 0–9616721–6–1.*

Talevi, R. et al, "Chemical Vapor Deposition and Physical Deposition of Metal/Barrier Binary Stacks on Polytetrafluoroethylene Low–k Dielectric", in Interconnect Techn. Conf., Proc. IEEE, Int., Jun. 1–3, 1998, San Fransisco, CA, USA (ISBN: 0–7803–4285–2).*

D.A. Babb et al., "Perfluorocyclobutane Aromatic Ether Polymers," *J. Polymer Sci. Part A: Polymer Chem.* 31, 3465–77 (1993).

(List continued on next page.)

Primary Examiner—Nathan J. Flynn
Assistant Examiner—Johannes Mondt
(74) Attorney, Agent, or Firm—Heslin Rothenberg Farley & Mesiti P.C.; Martha L. Boden, Esq.

(57) ABSTRACT

Structures and methods for preventing fluorine diffusion from a fluorinated dielectric material having a low dielectric constant are disclosed. Various fluorine diffusion barriers are described, each of which comprises doped or undoped silicon in combination with tantalum, tantalum nitride, tantalum silicide, cobalt, cobalt silicide, or mixtures thereof. Fluorine diffusion from fluorinated dielectrics is stopped by the barriers at temperatures as high as 450° C. In practice, one of the disclosed fluorine diffusion barriers is positioned between a fluorine-containing insulator and a conductive metal interconnect or metal interconnect diffusion barrier, thereby preventing diffusion of the fluorine atoms into the adjacent interconnect/barrier.

16 Claims, 7 Drawing Sheets

OTHER PUBLICATIONS

H. Bakhru et al., "Ion Beam Techniques for Low K Materials Characterization," *Mat. Res. Soc. Symp. Proc.* 511, 125–31 (1998).

E. Kolawa et al., "Amorphous Metallic Alloys: A New Advance in Thin–Film Diffusion Barriers for Copper Metallization," *SPIE Submicrometer Metallization* 1805, 11–17 (1992).

C.L. Shepard et al., "Interaction of Cu and $CoSi_2$," *Mat. Res. Soc. Symp. Proc.* 181, 105–10 (1990).

P.H. Townsend et al., "Interconnect Process Technology Using Perfluorocyclobutane (PFCB)," *Mat. Res. Soc. Symp. Proc.* 443, 35–40 (1997).

T. C. Nason et al., "Deposition of Amorphous Fluoropolymer Thin Films by Thermolysis of Teflon Amorphous Fluoropolymer," *Appl. Phys. Lett.* 60, 1–4 (1992).

S.E. Kim et al., "Characterization of PECVD Fluorinated Silicon Oxides and Stabilization of Interaction with Metals," *Mat. Res. Soc. Symp. Proc.* 511, 191–96 (1998).

J. O. Olowolafe et al., "Interactions of Cu with $CoSi_2$, $CrSi_2$ and $TiSi_2$ with and without $TiN_x$ Barrier Layers," *J. Appl. Phys.* 68, 6207–12 (1990).

M.J. DelaRosa et al., "Diffusion Barriers for Fluorinated Low–K Dielectrics," *Abstract for Oral Presentation at MRS 1999 Spring Meeting*, San Francisco, CA (Apr. 4, 1999).

S.C. Sun et al., "Evaluation of PTFE Nanoemulsion as a Low Dielectric Constant Material ILD," *Mat. Res. Soc. Symp. Proc.* 443, 85–90 (1997).

A.S. Harrus et al., "Parylene AF–4: A Low $\epsilon_R$ Material Candidate for ULSI Multilevel Interconnect Applications," *Mat. Res. Soc. Symp. Proc.* 443, 21–33 (1997).

K. Endo et al., "Fluorinated Amorphous Carbon This Films Grown From $C_4F_8$ for Multilevel Interconnections of Integrated Circuits," *Mat. Res. Soc. Symp. Proc.* 443, 165–170 (1997).

C. B. Labelle et al., "Preliminary Electrical Characterization of Pulsed–Plasma Enhanced Chemical Vapor Deposited Teflon–like Thin Films," *Mat. Res. Soc. Symp. Proc.* 443, 189–194 (1997).

* cited by examiner

FLUORINE DIFFUSION BARRIERS FOR FLUORINATED DIELECTRICS IN INTEGRATED CIRCUITS

FIELD OF THE INVENTION

The present invention relates to integrated circuits, and more particularly to methods and structures incorporating fluorine-containing dielectrics and fluorine diffusion barriers therein.

BACKGROUND OF THE INVENTION

Steady increases in the operating speeds of integrated circuits have arisen from decreasing transistor dimensions. In particular, smaller transistor gate lengths result in improved intrinsic gate delay, and, therefore, faster transistor switching times. However, as gate delay decreases, interconnect or "RC" delay increases, due to increased wiring capacitance. Thus, for transistors having device features less than about 0.25 µm, circuit performance becomes limited by RC delay rather than by gate delay. To improve interconnect performance and decrease RC delay, integrated circuit manufacturers now modify circuit design techniques, such as by limiting the wire length and by adding repeaters along long interconnect nodes. However, while these modifications reduce current interconnect delay problems, additional scaling down will require new methods and/or materials to reduce the interconnect resistance and capacitance.

At feature sizes below about 0.25 µm, it may be necessary to incorporate other materials into the transistor structure to minimize RC delay and to improve device performance. For example, existing interconnect metals, typically Al or an Al alloy, can be replaced with another metal, such as Cu, which has a resistivity ("R") about 35% lower than that of aluminum. Alternatively, or in combination therewith, the existing dielectric, typically silicon dioxide ($SiO_2$), which has a dielectric constant of 4.0, can be replaced with a material having a lower dielectric constant, thereby providing a lower capacitance ("C").

Of solid dielectric materials, fluorinated polymers have the lowest dielectric constants (as low as 1.9), and thus, confer the largest decreases in RC delay. However, one of the drawbacks to integrating fluorinated polymers into semiconducting devices is the instability of the fluorine. Fluorine has a tendency to diffuse out of the polymer and migrate into the adjacent interconnect metal. Therefore, in order to incorporate fluorine-containing dielectrics into semiconducting devices, a fluorine diffusion barrier must also be incorporated into the structure to separate the dielectric from the interconnect. However, such a diffusion barrier which can effectively stop fluorine migration at high processing temperatures is not available in the prior art.

Based on the above discussion, it is clear that as the dimensions of transistor devices decrease, it will become more and more desirable to incorporate fluorinated polymers into integrated circuit structures. These materials have low dielectric constants, making them attractive for lowering the RC delay, and therefore maximizing the operating speed. In order to use fluorinated dielectrics, it is clear that a need exists for diffusion barriers that can halt fluorine diffusion effectively. Furthermore, to be useful, such fluorine diffusion barriers should be thin. In addition, the barriers should have a low resistivity and/or low dielectric constant, so as not to diminish the gains attained by utilizing advanced interconnect and/or dielectric materials. Also, the diffusion barrier should be thermally stable over time so as to withstand high processing temperatures up to about 450° C.

The present invention fulfills the aforementioned needs and requirements by providing suitable and effective fluorine-diffusion barrier materials. Thus, the advantages of incorporating fluorine-containing dielectric polymers into semiconducting devices can now be realized. In addition, the present diffusion barriers are useful in connection with most fluorinated dielectrics and therefore the utility of such barriers is not limited by the particular dielectric being used.

SUMMARY OF THE INVENTION

Surprisingly, it has now been discovered that doped or undoped silicon when combined with tantalum or cobalt can be used as a fluorine diffusion barrier when positioned adjacent a fluorinated dielectric. Such a barrier layer stops fluorine atoms from diffusing into an overlying or underlying interconnect, even after thermal cycling at temperatures reaching 450° C. during subsequent chip fabrication processes.

Accordingly, the present invention provides structures and methods for preventing fluorine from diffusing out of a fluorine-containing dielectric and into an adjacent interconnect in an integrated circuit structure. As used herein, "interconnect" includes the conducting metal (e.g., aluminum, copper, tungsten, molybdenum, silver, gold) and also includes a metal interconnect diffusion barrier, such as TaN or TiN, if employed to block the metal from diffusing into the dielectric.

Thus, in one aspect the invention is an integrated circuit structure disposed on a substrate, wherein the structure comprises:
  (a) a fluorinated dielectric layer; and
  (b) a fluorine diffusion barrier adjacent the fluorinated dielectric layer. The fluorine diffusion barrier comprises doped or undoped silicon in combination with tantalum, tantalum nitride, tantalum silicide, cobalt, cobalt silicide, or a mixture thereof. The fluorine diffusion barrier may be a single layer, and the amount of silicon, if included in the single layer, may be graded. Alternatively, the barrier may be a double layer, or multiple alternating layers, wherein one of the layers (or one of the alternating layers) is silicon. Preferably, the fluorinated dielectric layer is selected from the group of perfluorocyclobutane (PFCB), fluorinated polyethylene, such as polytetrafluoroethylene (PTFE), fluorinated parylene, fluorinated amorphous carbon, and SiO:F. In some fabrication processes, it may be beneficial to include an adhesion promoting layer or nucleation layer interposed between the fluorine diffusion barrier and the fluorinated dielectric layer. Generally, the fluorine diffusion barrier ranges in thickness from about 1 to about 500 Å.

In another aspect, the present invention is a process for preventing diffusion of fluorine from a fluorinated dielectric layer into an interconnect. The process comprises:
  (a) providing a fluorinated dielectric layer on a substrate; and
  (b) depositing a fluorine diffusion barrier onto the fluorinated dielectric layer, wherein the fluorine diffusion barrier comprises doped or undoped silicon in combination with tantalum, tantalum nitride, tantalum silicide, cobalt, cobalt silicide, or a mixture thereof, wherein at temperatures up to at least 450° C., fluorine diffusion is prevented. An adhesion promoting layer or nucleation layer may be deposited onto the fluorinated dielectric layer, and the fluorine diffusion barrier would then be deposited onto the adhesion promoting layer or nucleation layer. Also, the process may include the step of depositing an interconnect onto the fluorine diffusion barrier.

In yet another aspect, the invention is a process for preventing diffusion of fluorine from a fluorinated dielectric layer into an interconnect, wherein the process comprises:

(a) providing a substrate having an interconnect thereon;

(b) depositing a fluorine diffusion barrier onto the interconnect, wherein the fluorine diffusion barrier comprises doped or undoped silicon in combination with tantalum, tantalum nitride, tantalum silicide, cobalt, cobalt silicide, or a mixture thereof; and (c) depositing a fluorinated dielectric layer onto the fluorine diffusion barrier. At temperatures up to at least 450° C., fluorine diffusion is prevented. An adhesion promoting layer or nucleation layer may be deposited onto the interconnect, after step (a), and the fluorine diffusion barrier would then be deposited onto the adhesion promoting layer or nucleation layer.

Other details and features of this invention will become clear from the following examples and the description of the preferred embodiments, taken in conjunction with the accompanying drawings.

DETAILED DESCRIPTION OF THE INVENTION

Figure 1:
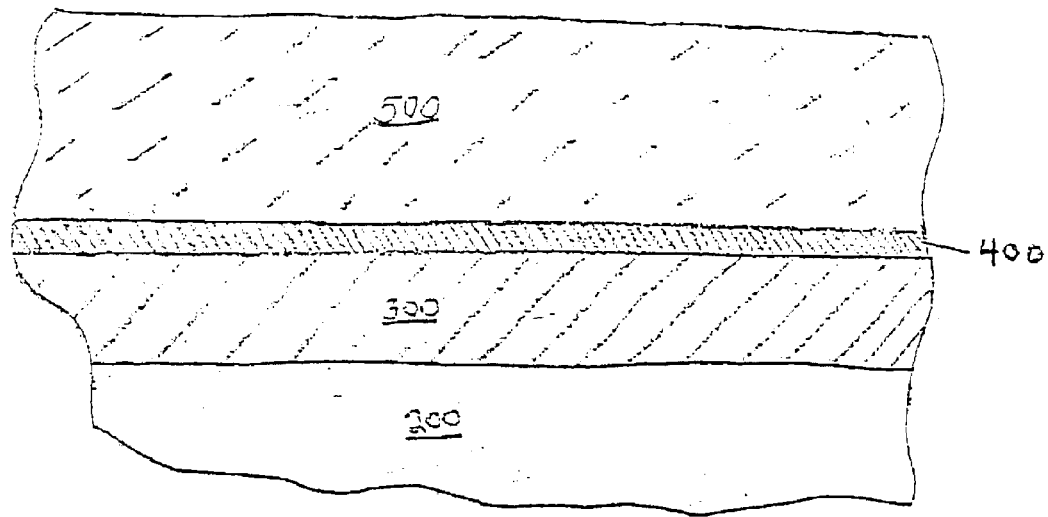
FIGS. 1–6 are schematic cross-sections of an IC device illustrating various fluorine diffusion barrier embodiments according to the present invention.

The current invention provides reliable fluorine diffusion barriers which are thin, robust, and have a low resistivity. Surprisingly, the barriers effectively halt fluorine from diffusing to overlying interconnect layer(s) for at least two hours at temperatures as high as 450° C. Before now, no material with such a low overall electrical resistance had been discovered for providing fluorine diffusion protection.

FIGS. 1–6 each depict a semiconductor structure in which the fluorine barrier system of the present invention has been incorporated. In each of FIGS. 1–4, substrate 200 has been provided with an overlying fluorinated dielectric layer 300, fluorine diffusion barrier 400 atop layer 300, and the optional interconnect 500 atop barrier 400. Each of FIGS. 1–4 shows a varied embodiment of barrier 400, which may be deposited as one or more layers.

Suitable materials for forming fluorine diffusion barrier 400 include tantalum, tantalum nitride, tantalum silicide, cobalt, cobalt silicide, and various combinations thereof with silicon (doped or undoped). When silicon is incorporated into the barrier, it is preferable to dope the silicon with standard components, such as boron, arsenic, or phosphorous in order to lower resistivity. The diffusion barrier materials listed above are typically deposited by chemical vapor deposition, atomic layer deposition, e-beam evaporation, or sputtering to a thickness (typically from about 1 Å to about 500 Å) sufficient to provide protection of the deposited interconnect 500 from fluorine diffusion. An optional heating/annealing step (up to about 450° C.) of the final structure may be performed in the presence of a nitrogen-bearing gas and in the absence of an oxygen-bearing gas or alternatively, under vacuum conditions.

The dielectric material depicted in the drawings as layer 300 can be any fluorinated dielectric. However, due to ease in preparation or commercial availability, preferred materials include, but are not limited to: perfluorocyclobutane (PFCB), which is available from Dow Chemical Company; fluorinated polyethylene films, such as polytetrafluoroethylene (PTFE), which is available as SPEEDFILM™ from W. L. Gore & Associates (see *Mat. Res. Soc. Symp. Proc.* 443, 85–90 (1997)), or as TEFLON® AF from DuPont, or other such films prepared by processes similar to that described by LaBelle et al. at *Mat. Res. Soc. Symp. Proc.* 443, 189–94 (1997); fluorinated parylene, such as RF-4 from Paratech or AF-4 from Speciality Coating Systems; fluorinated amorphous carbon (a: C—F) which may be prepared by a process similar to that described by Endo et al. at *Mat. Res. Soc. Symp. Proc.* 443, 165–70 (1997), and fluorinated silicon oxide (SiO:F), which may be prepared by the method described by Kim et al. at *Mat. Res. Soc. Symp. Proc.* 511, 191–96 (1998). The thickness of fluorinated dielectric layer 300 typically ranges from about 2000–5000 Å.

Shown in FIG. 1 atop fluorinated dielectric layer 300, fluorine diffusion barrier 400 is a single layer, which may be cobalt, tantalum, tantalum nitride, or a mixture thereof. However, when the barrier is one of these materials, then fluorinated dielectric layer 300 should contain silicon, such as when the dielectric is SiO:F. It has unexpectedly been discovered that when silicon is mixed with cobalt or tantalum in the diffusion barrier layer or at the interface of the dielectric and barrier layer, then resistance to fluorine diffusion is significantly enhanced. Thus, in FIG. 1, the single barrier layer 400 may instead be cobalt-silicon (including cobalt silicide), tantalum-silicon (including tantalum silicide), or cobalt-tantalum-silicon (including either or both silicides). This latter list of barrier materials may be used adjacent any fluorinated dielectric layer 300, regardless of whether the dielectric contains silicon.

Alternatively, as shown in FIG. 1, single diffusion barrier layer 400 may be a graded coating of doped or undoped silicon and of tantalum, tantalum nitride, tantalum silicide, cobalt, cobalt silicide, or a mixture thereof, in contact with fluorinated dielectric layer 300. The composition of barrier 400 adjacent dielectric layer 300 typically begins as 100% silicon, then the cobalt and/or tantalum content increases from zero at the dielectric interface, to an amount ranging in atomic percentage from about 50% to 100% at the interconnect interface, but usually greater than 65%, (atomic percent) at the layer in contact with interconnect 500. The cobalt or tantalum may either be elemental, or a compound, including silicide or nitride. The thickness of fluorine diffusion barrier 400, when deposited as a single layer (FIG. 1), ranges from about 1 to about 500 Å, but more preferably ranges from about 50 Å to about 200 Å.

Adjacent fluorine diffusion barrier 400 is interconnect 500, which is typically deposited to a thickness of about 2000 Å. As shown in FIGS. 1–4, interconnect 500 is deposited atop barrier 400. Alternatively, as discussed below, the interconnect layer may instead be deposited atop the substrate, prior to the respective deposition of a fluorine diffusion barrier on the interconnect and a fluorinated dielectric layer on the fluorine diffusion barrier. Any conductive metal may be used as interconnect 500 in the practice of the present invention including, but not limited to copper, aluminum, tungsten, gold, silver, or molybdenum. However, conductive metal interconnect 500 will usually be copper because of its low electrical resistance and its efficient use in dual demascene techniques. When metal interconnect 500 is copper, it is usually beneficial to include a copper diffusion barrier layer having a thickness of about 25–100 Å (not shown) between the copper interconnect 500 and fluorine diffusion barrier layer 400. Such a metal diffusion barrier layer is necessary because of the propensity of copper to diffuse under an applied bias. Examples of suitable copper barrier layers include tantalum nitride (TaN) and titanium nitride (TiN). As stated above, the term "interconnect" and, as shown, reference number 500 includes a conductive metal as well as a metal diffusion barrier when one is employed.

Figure 2:
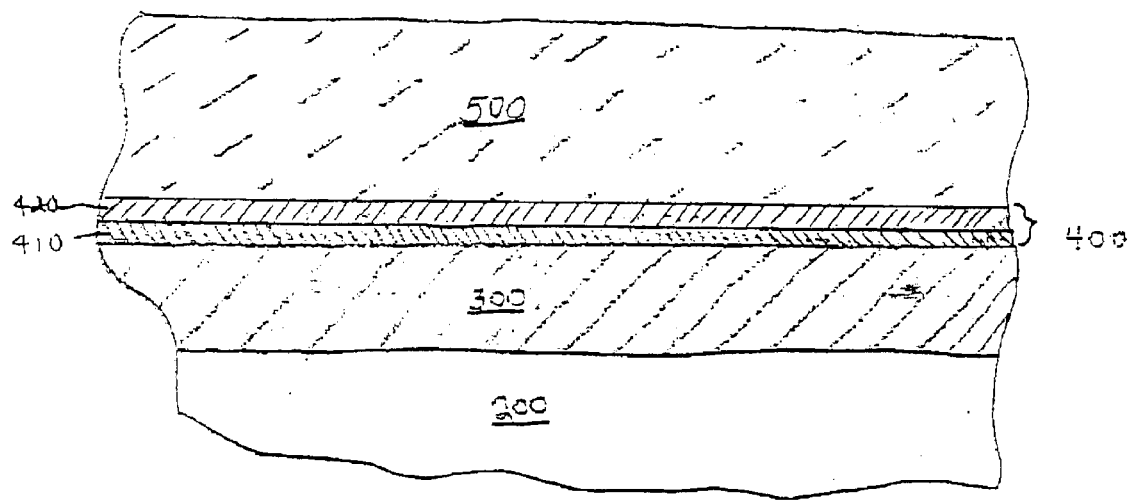

FIG. 2 shows another embodiment of diffusion barrier layer 400, which may be used with any fluorinated dielectric. Fluorine diffusion barrier 400 comprises two layers including silicon layer 410, which is adjacent the fluorinated dielectric and which is preferably, but not necessarily, doped. Silicon layer 410 is deposited onto fluorine dielectric 300 to a thickness ranging from about 1 to about 500 Å, but preferably from about 5 to about 200 Å. A second layer 420 comprising cobalt, tantalum, tantalum nitride, or a mixture thereof; or of cobalt-silicon (including cobalt silicide), tantalum-silicon (including tantalum silicide), or cobalt-tantalum-silicon (including either or both silicides) contacts silicon layer 410. Second layer 420 is deposited to a thickness ranging from about 1 to about 500 Å. The total thickness of diffusion barrier 400 is preferably about 100 Å, but generally not greater than about 500 Å. Interconnect 500 contacts second layer 420.

Figure 3:
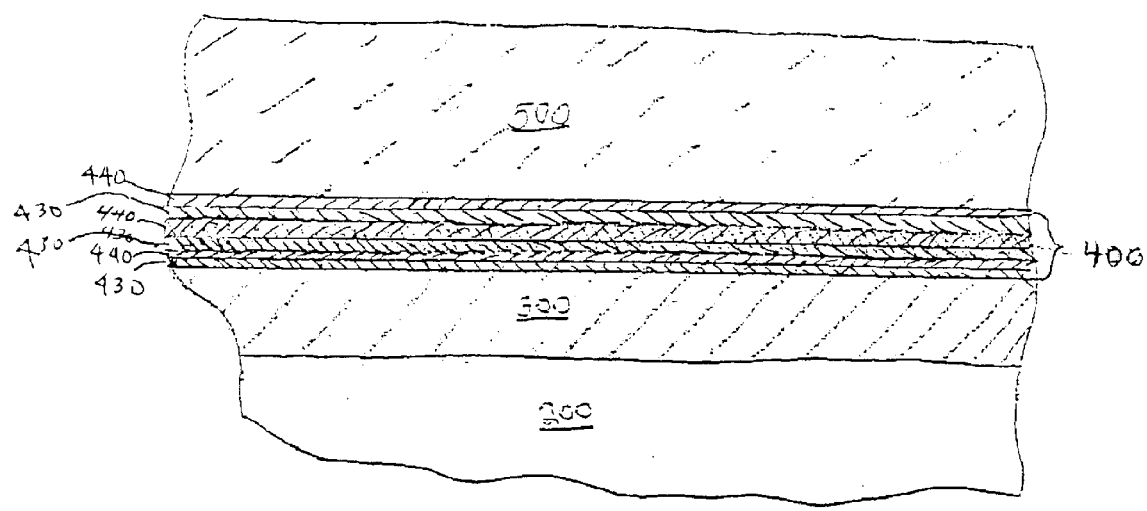

FIG. 3 shows the present diffusion barrier structure 400 as a plurality of alternating layers, wherein a layer of silicon 430 (doped or undoped) alternates in the structure with a layer 440 of cobalt and/or tantalum and/or tantalum nitride; or of cobalt-silicon, (including cobalt silicide), tantalum-silicon (including tantalum silicide), or cobalt-tantalum-silicon (including either or both silicides). FIG. 3 shows an example of a 6-layer structure, but the number of layers in barrier 400 can range from 3 to about 500. The thickness of each layer ranges from about 1 to about 500 Å, but each layer is preferably less than 50 Å. Interconnect layer 500 lies adjacent the terminating layer.

Figure 4:
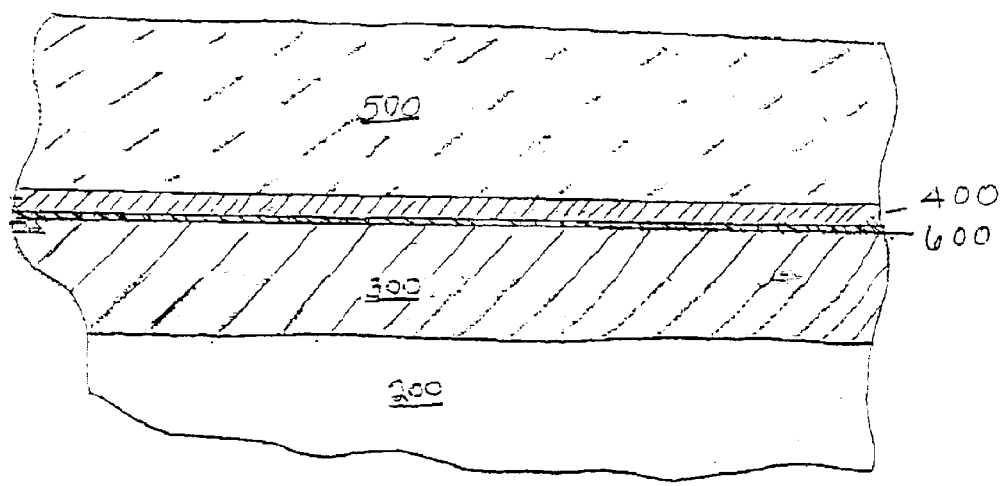

Optionally, as shown in FIG. 4, a thin (about 10 Å) nucleation or adhesion promoting layer 600, such as chromium or titanium, may be interposed between diffusion barrier 400 and fluorinated dielectric layer 300. Although delamination caused by poor adhesion or stress is generally not a concern with the present barriers, in some cases, as will be recognized by those of skill, it may be desirable to include such an adhesion layer 600. For example, some temperature cycling processes may indicate that an interposed layer to promote adhesion would be advantageous.

Figure 5:
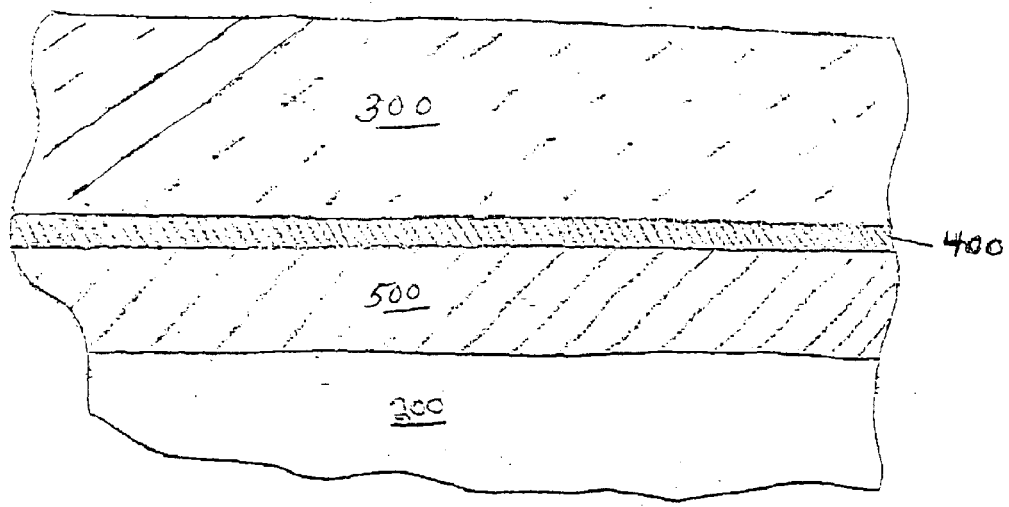
Figure 6:
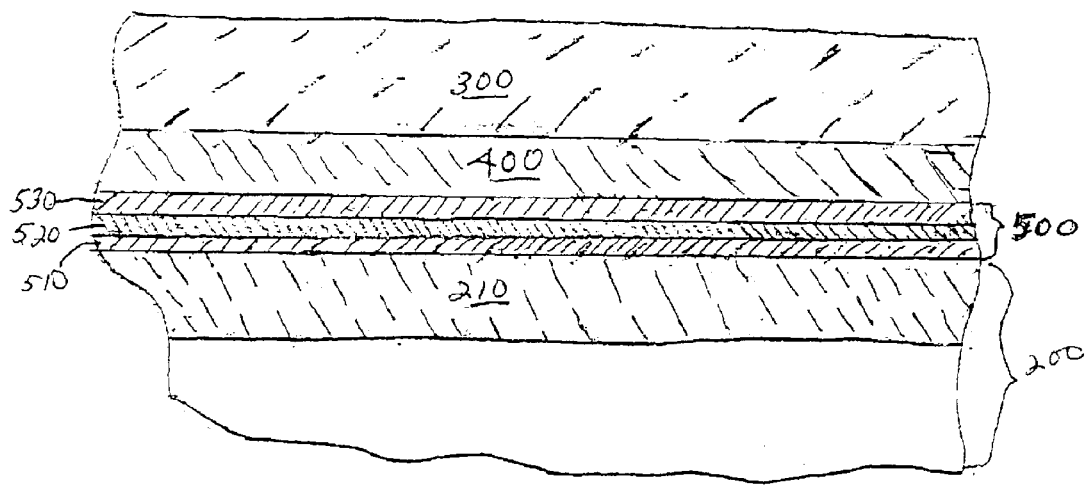

Alternatively, as shown in FIGS. 5–6, the invention also includes IC structures in which the materials depicted in FIGS. 1–4 are deposited over the substrate in reverse order. For simplicity, however, fluorine diffusion barrier 400 has been shown in FIGS. 5–6 as a single layer, but it will be understood by those of ordinary skill in the art that the previously described bilayer and multiple layer embodiments for the barrier are also contemplated for use in this reverse design. In these embodiments, the order of the layers that form the fluorine diffusion barrier (as shown in FIGS. 2–4) are also reversed.

FIG. 5 shows interconnect 500 positioned directly atop substrate 200. Fluorine diffusion barrier 400 is then deposited atop interconnect 500, and fluorinated dielectric layer 300 is deposited atop fluorine diffusion barrier 400. Thus, in accordance with the present invention, fluorine diffusion barrier 400 is adjacent fluorinated dielectric layer 300, thereby separating the dielectric from interconnect 500 (i.e. it's "sandwiched" between the two).

FIG. 6 shows the inclusion of copper metal diffusion barriers in the structure. In this depiction, substrate 200 includes silicon dioxide dielectric 210. Interconnect 500 is disposed on substrate 200 and includes: bottom TaN layer 510, which acts as a barrier to prevent copper from diffusing into the $SiO_2$ layer; copper metal layer 520, and top TaN layer 530, which is also a copper diffusion barrier preventing Cu diffusion into the overlying layers. Fluorine diffusion barrier 400 is deposited atop interconnect 500, and fluorinated dielectric layer 300 is deposited adjacent barrier 400.

Furthermore, it should be noted that a typical integrated circuit structure may have eight or more interconnect (metal) layers stacked on top of each other. Interposed between one or more interconnect layers may be a fluorinated dielectric layer. Accordingly, the present invention also embraces these multilevel structures wherein a fluorine diffusion barrier separates an interconnect layer from a corresponding fluorinated dielectric layer. Also, the substrate, as described herein, may encompass lower levels of the stack.

The invention is illustrated by the examples below, as well as by the drawings.

EXAMPLES

In the following examples, aluminum was selected as the metal interconnect because fluorine readily diffuses through aluminum. The aluminum cap was deposited to a thickness of about 2000 Å using e-beam evaporation at a rate of 5 Å/s.

Films were annealed at temperatures ranging from 325° C. to 450° C. for 2 hours in a tube furnace with flowing nitrogen at approximately 0.3 liters/minute. Samples were loaded into the cool zone of the reactor and transported using an actuator into the heated zone. A thermocouple was in contact with the sample to verify the temperature during annealing.

The fluorine concentration was measured by nuclear reaction analysis (F NRA). The gamma rays from the reaction were detected by a BGO detector located about 2 cm behind the sample. The fluorine concentration at a given depth is directly proportional to the measured gamma ray output. For calibration of the concentration scale, thick $CaF_2$ crystals and a known amount of fluorine implanted in Si wafers were used as standards.

Example 1

The fluorine diffusion barrier was 100 Å of cobalt on 100 Å of silicon. The underlying fluorinated dielectric was perfluorocyclobutane (PFCB—from Dow Chemical). The top metal layer was aluminum.

The PFCB film was deposited onto a native oxide covered 100 mm silicon wafer by spin-on techniques. Sputtering of the diffusion barrier and aluminum was performed using a CVC dc magnetron sputtering system. The sample was annealed at 375° C. for two hours.

Figure 7:
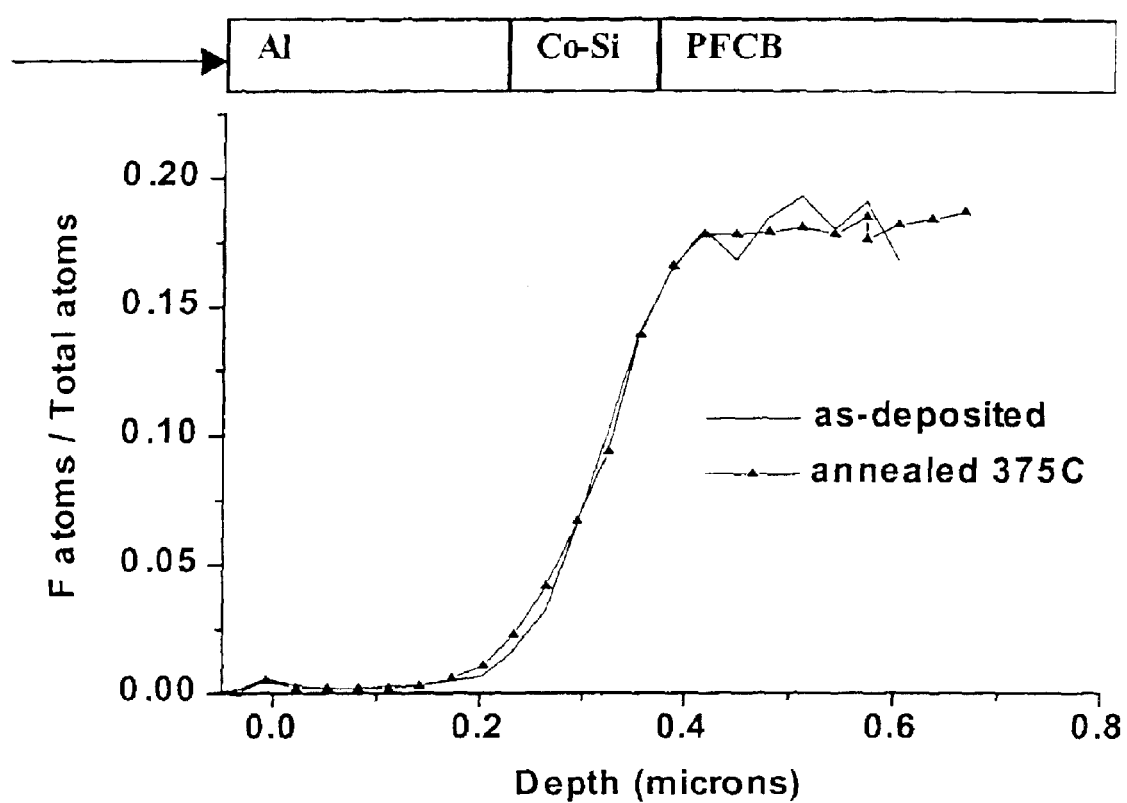
FIG. 7 is a graph of fluorine atoms vs. depth (microns) for as-deposited and annealed (375° C.) Al/Co/Si/PFCB samples, which shows that even after annealing, no fluorine diffusion was observed in the Al overlayer.

FIG. 7 is a graph showing the fluorine profile of the as-deposited and annealed Al/Co/Si/PFCB sample, as measured by F NRA analysis. No fluorine diffusion was detected in the aluminum overlayer, even after heating. Thus, it is clear that the barrier prevented fluorine diffusion from the PFCB dielectric to the aluminum layer.

Example 2

The procedure of example 1 was followed except that the fluorine diffusion barrier was 50 Å of tantalum on 150 Å of silicon.

Figure 8:
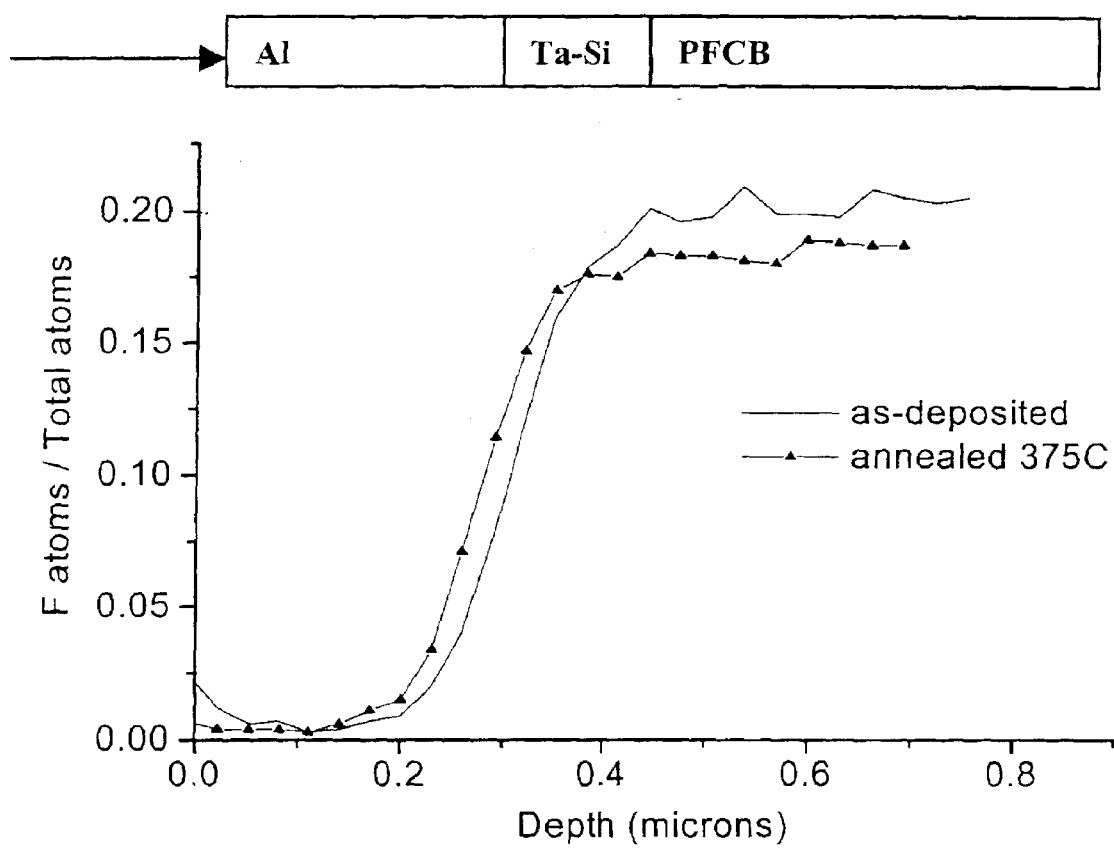
FIG. 8 is a graph of fluorine atoms vs. depth (microns) for as-deposited and annealed (375° C.) Al/Ta/Si/PFCB samples, which shows that even after annealing, no fluorine diffusion was observed in the Al overlayer.

FIG. 8 is a graph showing the fluorine profile of the as-deposited and annealed Al/Ta/Si/PFCB sample, as measured by F NRA analysis. No fluorine diffusion was detected in the aluminum overlayer, even after heating.

Example 3

The procedure of Example 1 was followed, except that the fluorine barrier layer in contact with the PFCB dielectric layer was a single graded layer of silicon and tantalum, beginning with 100% silicon. The tantalum content in the barrier increased from zero at the dielectric interface, to 100% at the aluminum interface. The total barrier thickness was 200 Å. The tantalum was elemental.

Figure 9:
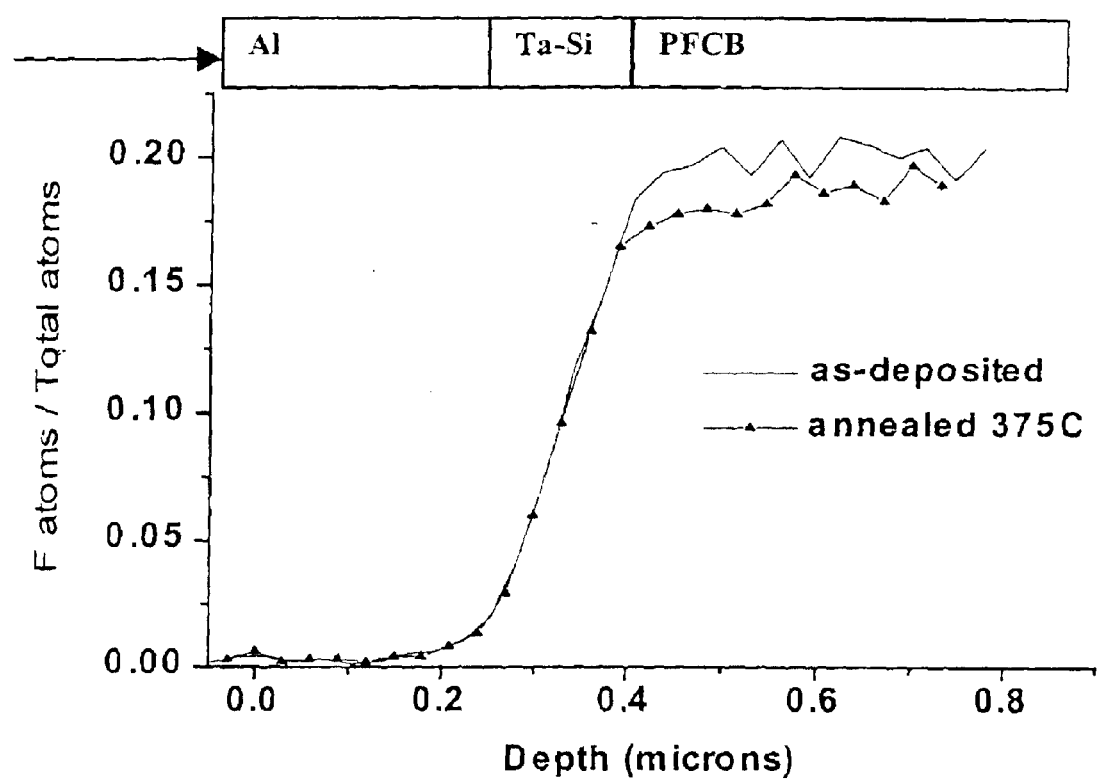
FIG. 9 is a graph of fluorine atoms vs. depth (microns) for as-deposited and annealed (375° C.) Al/Ta/TaSi/Si/PFCB samples, which shows that even after annealing, no fluorine diffusion was observed in the Al overlayer.

FIG. 9 is a graph showing the fluorine profile of the as-deposited and annealed Al/Ta/TaSi/Si/PFCB sample, as measured by F NRA analysis. No fluorine diffusion was detected in the aluminum overlayer.

Example 4

The fluorine diffusion barrier was 200 Å of cobalt, and the underlying fluorinated dielectric material was SiO:F. The top metal layer was aluminum.

The SiO:F film was deposited in an Applied Material Precision-5000 single wafer parallel plate plasma enhanced chemical vapor deposition (PECVD) reactor using TEOS, $O_2$ and $NF_3$. Sputtering of the diffusion barrier and aluminum was performed using a CVC dc magnetron sputtering system. The sample was annealed at 450° C. for two hours.

Figure 10:
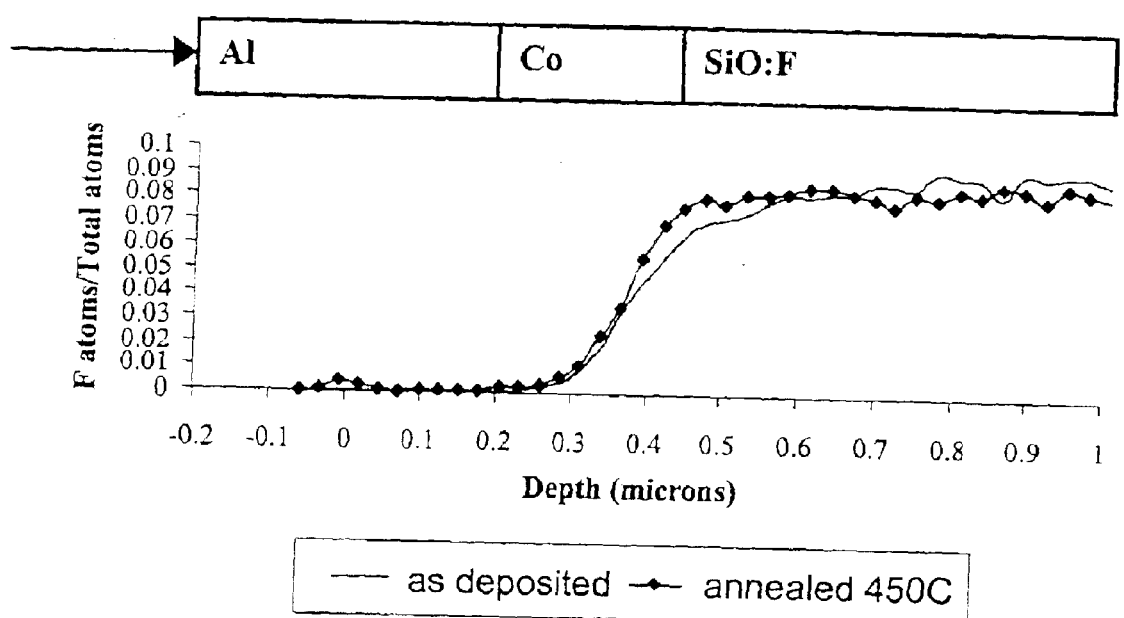
FIG. 10 is a graph of fluorine atoms vs. depth (microns) for as-deposited and annealed (450° C.) Al/Co/SiO:F samples, which shows that even after annealing, no fluorine diffusion was observed in the Al overlayer.

FIG. 10 is a graph showing the fluorine profile of the as-deposited and annealed Al/Co/SiO:F sample, as measured by F NRA analysis. No fluorine diffusion was detected in the aluminum overlayer.

Example 5—Control

In order to verify the F NRA results of fluorine diffusing into aluminum, a control sample was fabricated having 2000 Å of evaporated aluminum on SiO:F. This sample was annealed at 450° C. for 2 hours. The results showed a heavy accumulation of fluorine in the first 1000 Å of the film, and a lower concentration of fluorine extending to the surface of the film. Similar results were obtained with Al capped copper on SiO:F.

The above examples demonstrate that the present fluorine barrier film is stable (no diffusion) at temperatures generally required during chip processing. For example, the deposition of Cu films to form metal interconnects typically requires a temperature of about 300° C. Furthermore, chip packaging often requires an annealing temperature up to 400° C. Thus, the present invention provides useful semiconductor fabrication methods and structures which avoid fluorine diffusion from a fluorinated dielectric material into an overlying metal interconnect. This results in improved IC device performance.

All of the journal articles mentioned above are incorporated herein by reference.

While the invention has been particularly shown and described with reference to the preferred embodiments thereof, it will be understood by those skilled in the art that other changes in form and details may be made therein without departing from the spirit and scope of the invention.

What is claimed is:

1. An integrated circuit structure disposed on a substrate, wherein said structure comprises:
   (a) a fluorinated polymer dielectric layer; and
   (b) a fluorine diffusion barrier adjacent said fluorinated polymer dielectric layer and positioned between said fluorinated polymer dielectric layer and a metal interconnect, wherein at each location between said fluorinated polymer dielectric layer and said metal interconnect said fluorine diffusion barrier comprises doped or undoped silicon in combination with a material or any mixture of materials selected out of the collection of materials consisting of: tantalum, tantalum silicide, cobalt, and cobalt silicide.

2. The structure of claim 1, wherein said fluorinated polymer dielectric layer is selected from the group of perfluorocyclobutane (PFCB), fluorinated polyethylene, polytetrafluoroethylene (PTFE), and fluorinated parylene.

3. The structure of claim 1, wherein said fluorine diffusion barrier is a single layer of a material or any mixture of materials selected out of the collection of materials consisting of: cobalt-silicon, cobalt silicide, tantalum-silicon, tantalum silicide, cobalt-tantalum-silicide, -silicon, cobalt-tantalum silicide, tantalum-cobalt silicide, and cobalt silicide-tantalum silicide.

4. The structure of claim 3, wherein said fluorinated polymer dielectric layer is selected from the group of perfluorocyclobutane (PFCB), fluorinated polyethylene, polytetrafluoroethylene (PTFE), and parylene-F.

5. An integrated circuit structure disposed on a substrate, wherein said structure comprises:
   (a) a fluorinated polymer dielectric layer; and
   (b) a fluorine diffusion barrier adjacent said fluorinated polymer dielectric layer and positioned between said fluorinated polymer dielectric layer and a metal interconnect, wherein said fluorine diffusion barrier comprises doped or undoped silicon in combination with a material or any mixture of materials selected out of the collection of materials consisting of: tantalum, tantalum nitride, tantalum silicide, cobalt, and cobalt silicide, and wherein said fluorine diffusion barrier is a single layer comprising a graded coating of said doped or undoped silicon and said tantalum, tantalum nitride, tantalum silicide, cobalt, cobalt silicide, or mixture thereof, wherein said graded coating begins at the dielectric interface as 100% silicon, and wherein the atomic percentage of said tantalum, tantalum nitride, tantalum silicide, cobalt, cobalt silicide, or mixture thereof increases from zero at the dielectric interface to an amount ranging from about 50% to 100% at the interconnect interface.

6. The structure of claim 5, wherein said fluorinated polymer dielectric layer is selected from the group of perfluorocyclobutane (PFGB), fluorinated polyethylene, polytetrafluoroethylene (PTFE), and fluorinated parylene.

7. An integrated circuit structure disposed on a substrate, wherein said structure comprises:
   a) a fluorinated polymer dielectric layer; and
   b) a fluorine diffusion barrier adjacent said fluorinated polymer dielectric layer and positioned between said fluorinated polymer dielectric layer and a metal interconnect, wherein said fluorine diffusion barrier comprises two adjacent layers, wherein one layer is doped or undoped silicon and the other layer comprises a material or any mixture of materials selected out of the collection of materials consisting of: tantalum, tantalum nitride, tantalum silicide, tantalum-silicon, cobalt-tantalum-silicon, cobalt-tantalum silicide, tantalum-cobalt silicide, and cobalt silicide-tantalum silicide, and wherein said silicon layer is adjacent said fluorinated polymer dielectric layer.

8. The structure of claim 7, wherein said fluorinated polymer dielectric layer is selected from the group of perfluorocyclobutane (PFCB), fluorinated polyethylene, polytetrafluoroethylene (PTFE), and fluorinated parylene.

9. An integrated circuit structure disposed on a substrate, wherein said structure comprises:

a) a fluorinated polymer dielectric layer; and b) a fluorine diffusion barrier adjacent said fluorinated polymer dielectric layer and positioned between said fluorinated polymer dielectric layer and a metal interconnect, wherein said fluorine diffusion barrier comprises doped or undoped silicon in combination with a material or any mixture of materials selected out of the collection of materials consisting of: tantalum, tantalum nitride, tantalum silicide, cobalt, and cobalt silicide, and wherein said fluorine diffusion barrier comprises from three to about 500 alternating layers, wherein a layer of doped or undoped silicon alternates with a layer made of a material or any mixture of materials selected out of the collection of materials consisting of: tantalum, tantalum nitride, tantalum silicide, tantalum-silicon, cobalt, cobalt silicide, cobalt-silicon, cobalt-tantalum-silicon, cobalt-tantalum silicide, tantalum-cobalt silicide, and cobalt silicide-tantalum silicide.

10. The structure of claim 9, wherein said fluorinated polymer dielectric layer is selected from the group of perfluorocyclobutane (PFCB), fluorinated polyethylene, polytetrafluoroethylene (PTFE), and fluorinated parylene.

11. The structure of claim 1, further comprising an adhesion promoting layer interposed between said fluorine diffusion barrier and said fluorinated polymer dielectric layer.

12. The structure of claim 1, wherein said fluorine diffusion barrier ranges in thickness from about 1 to about 500 Å.

13. The structure of claim 1, wherein said metal interconnect is selected from the group of copper, aluminum, tungsten, molybdenum, silver, gold, tantalum nitride, and titanium nitride.

14. An integrated circuit structure disposed on a substrate, wherein said structure comprises:

(a) a fluorinated dielectric layer containing doped or undoped silicon therein; and (b) a fluorine diffusion barrier adjacent said fluorinated dielectric layer and positioned between said fluorinated dielectric layer and a metal interconnect, wherein said fluorine diffusion barrier is a single layer of a material or any mixture of materials selected out of the collection of materials consisting of: cobalt and tantalum; and wherein at the interface between said silicon-containing fluorinated dielectric layer and said fluorine diffusion barrier, there is a blend of said silicon and said material or said mixture of said materials selected from the latter collection of materials.

15. The structure of claim 14, wherein said fluorinated dielectric layer is fluorinated silicon oxide (SiO:F).

16. An integrated circuit structure disposed on a substrate, wherein said structure comprises:

(a) a fluorinated polymer dielectric layer; and (b) a fluorine diffusion barrier adjacent said fluorinated polymer dielectric layer and positioned between said fluorinated polymer dielectric layer and a metal interconnect, wherein said fluorine diffusion barrier comprises doped or undoped silicon in combination with tantalum nitride and any mixture of materials selected out of the collection of materials consisting of cobalt and cobalt silicide.

* * * * *

UNITED STATES PATENT AND TRADEMARK OFFICE
CERTIFICATE OF CORRECTION

PATENT NO. : 6,818,990 B2
DATED : November 16, 2004
INVENTOR(S) : DelaRosa et al.

It is certified that error appears in the above-identified patent and that said Letters Patent is hereby corrected as shown below:

Column 8,
Line 30, delete the words "cobalt-tantalum-silicide, - silicon" and insert -- cobalt-tantalum-silicon, -- in the first instance Signed and Sealed this Eighth Day of February, 2005

JON W. DUDAS
*Director of the United States Patent and Trademark Office*